US009448289B2

(12) United States Patent
Wang et al.

(10) Patent No.: US 9,448,289 B2
(45) Date of Patent: Sep. 20, 2016

(54) BACKGROUND FIELD REMOVAL METHOD FOR MRI USING PROJECTION ONTO DIPOLE FIELDS

(75) Inventors: Yi Wang, New York, NY (US); Ludovic de Rochefort, Cachan (FR); Tian Liu, New York, NY (US); Ildar Khalidov, St. Petersburg (RU)

(73) Assignee: CORNELL UNIVERSITY, Ithaca, NY (US)

( * ) Notice: Subject to any disclaimer, the term of this patent is extended or adjusted under 35 U.S.C. 154(b) by 697 days.

(21) Appl. No.: 13/304,141

(22) Filed: Nov. 23, 2011

(65) Prior Publication Data
US 2012/0141003 A1    Jun. 7, 2012

Related U.S. Application Data

(60) Provisional application No. 61/416,696, filed on Nov. 23, 2010.

(51) Int. Cl.
*G06K 9/00* (2006.01)
*G01R 33/24* (2006.01)
*G01R 33/56* (2006.01)

(52) U.S. Cl.
CPC ........... *G01R 33/24* (2013.01); *G01R 33/5608* (2013.01); *G06T 2207/10088* (2013.01)

(58) Field of Classification Search
CPC .... G01R 33/24; G01R 33/54; G01R 33/563; G01R 33/5601; G01R 33/5607; G01R 33/5608; G01R 33/56536; G01R 33/56563; G01R 33/56572; G01R 33/56581; G01R 33/5659; G06T 2207/10088
See application file for complete search history.

(56) References Cited

U.S. PATENT DOCUMENTS

2011/0044524 A1*  2/2011  Wang et al. .................. 382/131
2013/0221961 A1*  8/2013  Liu ............................... 324/307

OTHER PUBLICATIONS

Sekihara et al., "Noise Covariance Incorporated MEG-MUSIC Algorithm: A Method for Multiple-Dipole Estimation Tolerant of the Influence of Background Brain Activity", Sep. 9, 1997, IEEE Transactions on Biomedical Engineering, vol. 44, No. 9, p. 839-847.*
"Hilbert space", Feb. 7, 2010, Wikipedia.org, p. 7-8.*
de Rochefort et al., "Quantitative susceptibility map reconstruction from MR phase data using bayesian regularization: Validation and application to brain imaging", Dec. 1, 2009, Wiley-Liss, Magnetic Resonance in Medicine, vol. 63, iss. 1, p. 194-206.*

(Continued)

*Primary Examiner* — Stephen R Koziol
*Assistant Examiner* — Timothy Choi
(74) *Attorney, Agent, or Firm* — Leydig, Voit & Mayer, Ltd.

(57) ABSTRACT

For optimal image quality in susceptibility-weighted imaging and accurate quantification of susceptibility, it is necessary to isolate the local field generated by local magnetic sources (such as iron) from the background field that arises from imperfect shimming and variations in magnetic susceptibility of surrounding tissues (including air). We present a nonparametric background field removal method based on projection onto dipole fields in which the background field inside an ROI is decomposed into a field originating from dipoles outside the ROI using the projection theorem in Hilbert space.

14 Claims, 5 Drawing Sheets

(56) References Cited

OTHER PUBLICATIONS

Figure 1:
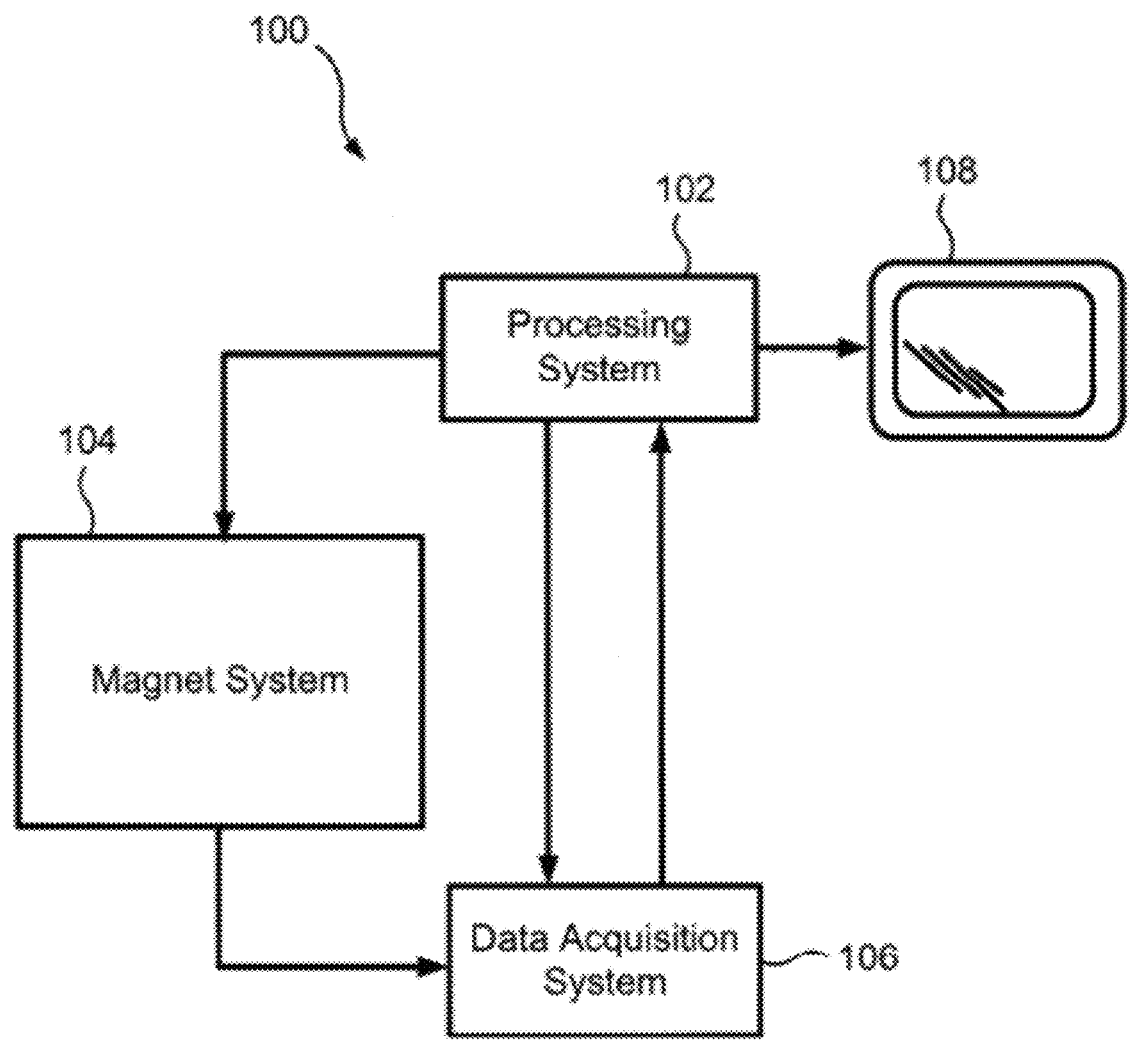

Björck, Iterative methods for least squares problems. Numerical Methods for Least Squares Problems, *Society for Industrial Mathematics: Philadelphia, Pennsylvania,* pp. 269-270, 290-292 (1996).
Cusack, et al., New robust 3-D phase unwrapping algorithms: application to magnetic field mapping and undistorting echoplanar images. *Neuroimage* 16(3 Pt 1): 754-764 (2002).
De Rochefort, et al., A Weighted Gradient Regularization Solution to the Inverse Problem from Magnetic Field to Susceptibility Maps (Magnetic Source MRI): Validation and Application to Iron Quantification in the Human Brain. *Proc ISMRM* 462 (2009).
De Rochefort, et al., In vivo quantification of contrast agent concentration using the induced magnetic field for time-resolved arterial input function measurement with MRI. *Medical physics* 35(12): 5328-5339 (2008).
De Rochefort, et al. Quantitative susceptibility map reconstruction from MR phase data using bayesian regularization: validation and application to brain imaging. *Magn. Reson. Med.* 63(1): 194-206 (2010).
De Rochefort, et al., Quantitative MR susceptibility mapping using piece-wise constant regularized inversion of the magnetic field, *Magn Reson Med;* 60(4): 1003-1009 (2009).
Fernandez-Seara, et al., MR susceptometry for measuring global brain oxygen extraction. *Magn Reson Med* 55(5): 967-973 (2006).
Haacke, et al., Imaging iron stores in the brain using magnetic resonance imaging. *Magn. Reson. Imaging* 23(1): 1-25 (2005).
Haacke, et al., Susceptibility weighted imaging (SWI). *Magn Reson Med* 52(3): 612-618 (2004).
Haacke, et al. Objects in external fields: the Lorentz sphere. *Magnetic Resonance Imaging: Physical Principles and Sequence Design.* Wiley-Liss: New York, pp. 749-757 (1999).
Koch, et al. , Rapid calculations of susceptibility-induced magnetostatic field perturbations for in vivo magnetic resonance. *Physics in medicine and biology* 51(24):6381-6402 (2006).
Kressler, et al., Nonlinear Regularization for Per Voxel Estimation of Magnetic Susceptibility Distributions from MRI Field Maps. *IEEE transactions on medical imaging* (2009).
Langham, et al. Retrospective correction for induced magnetic field inhomogeneity in measurements of large-vessel hemoglobin oxygen saturation by MR susceptometry. *Magn Reson Med* 61(3): 626-633 (2009).
Li, et al., Quantifying arbitrary magnetic susceptibility distributions with MR. *Magnet Reson Med* 51(5): 1077-1082 (2004).
Li, et al., High-precision mapping of the magnetic field utilizing the harmonic function mean value property. *J. Magn. Reson.* 148(2): 442-448 (2001).
Liu, et al., Calculation of susceptibility through multiple orientation sampling (COSMOS): a method for conditioning the inverse problem from measured magnetic field map to susceptibility source image in MRI. *Magn Reson Med* 61(1): 196-204 (2009).
Liu, et al., Morphology enabled dipole inversion for quantitative susceptibility mapping using structural consistency between the magnitude image and the susceptibility map. *Neuroimage.* (Sep. 8, 2011).
Liu, et al., Morphology enabled dipole inversion (MEDI) from a single-angle acquisition: comparison with COSMOS in human brain imaging. *Magn Reson Med.* ;66(3): 777-83 (Sep. 2011).
Liu, et al., A novel background field removal method for MRI using projection onto dipole fields (PDF). *NMR Biomed.;* 24(9): 1129-36 (Nov. 2011).
Liu, et al., Unambiguous identification of superparamagnetic iron oxide particles through quantitative susceptibility mapping of the nonlinear response to magnetic fields. *Magn Reson Imaging.* 28(9):1383-9 (Nov. 2010).
Marques, et al., Application of a Fourier-based method for rapid calculation of field inhomogeneity due to spatial variation of magnetic susceptibility. *Concepts in Magnetic Resonance Part B: Magnetic Resonance Engineering* 258(1):65-78 (2005).
Moon, et al., Pseudoinverses and the SVD. Mathematical Methods and Algorithms for Signal Processing, *Prentice Hall: Upper Saddle River, New Jersey,* pp. 116-117 (2000).
Neelavalli, et al., Removing background phase variations in susceptibility-weighted imaging using a fast, forward-field calculation. *J Magn Reson Imaging* 29(4):937-948 (2009).
Salomir, et al., A fast calculation method for magnetic field inhomogeneity due to an arbitrary distribution of bulk susceptibility. *Concept Magn Reson* B 19B(1):26-34 (2003).
Shmueli, et al., Magnetic susceptibility mapping of brain tissue in vivo using MRI phase data. *Magn. Reson. Med.* 62(6): 1510-1522 (2009).
Wang, et al., Artery and vein separation using susceptibility-dependent phase in contrast-enhanced MRA. *J Magn Reson Imaging* 12(5): 661-670 (2000).
Wharton, et al., Susceptibility mapping in the human brain using threshold-based k-space division. *Magn. Reson. Med.* 63(5): 1292-1304 (2010).
Yao, et al., Susceptibility contrast in high field MRI of human brain as a function of tissue iron content. *Neuroimage* 44(4):1259-1266 (2009).
Akbudak, et al., Contrast-Agent Phase Effects: An Experimental System for Analysis of Susceptibility, Concentration, and Bolus Input Function Kinetics, *Magn Reson Med,* 38: 990-1002 (1997).
Albert, et al, Susceptibility Changes Following Bolus Injections, *Magn Reson Med,* 29: 700-708 (1993).
Ben-Israel et al., *Generalized inverses, theory and applications,* $2^{nd}$ edition, Society CM, editor, New York: Springer, p. 118-122 (2000).
Beutler, et al., Iron Deficiency and Overload, *Hematol Am Soc Hematol Educ Program,* p. 40-61 (2003).
Chu, et al., MRI Measurement of Hepatic Magnetic Susceptibility—Phantom Validation and Normal Subject Studies, *Magn Reson in Med.* 52: 1318-1327 (2004).
Collins et al., Numerical calculations of the static magnetic field in three-dimensional multi-tissue models of the human head, *Magn Reson Imaging,* 20: 413-424 (2002).
Conturo et al., Signal-to-Noise in Phase Angle Reconstruction: Dynamic Range Extension Using Phase Reference Offsets, *Magn Reson Med,* 15: 420-437 (1990).
Corot et al, Recent advances in iron oxide nanocrystal technology for medical imaging,*Adv Drug Deliv Rev,* 58: 1471-1504 (2006).
Dias et al, the ZpiM Algorithm: A Method for Interferometric Image Reconstruction in SAR/SAS, *IEEE Trans Image Processing,* 11(4): 408-422 (2002).
Gonzalez et al., Image Restoration, *Digital Image Processing,* Reading MA: Addison Wesley, p. 253-305 (1992).
Hamalainen, et al., Magnetoencephalography: theory, instrumentation, and applications to noninvasive studies of the working human brain, *Reviews of Modern Physics,* 65: 413-497 (1993).
Hestenes et al., Methods of Conjugate Gradients for Solving Linear Systems, *J Research Natl Bureau Standards,* 49(6): 409-436 (1952).
Hoffman, Measurement of magnetic susceptibility and calculation of shape factor of NMR samples, *J Magnetic Resonance,* 178: 237-247 (2006).
Holt et al., MR Susceptometry: an External-Phantom Method for Measuring Bulk Susceptibility from Field-Echo Phase Reconstruction Maps, *Magn Reson Imaging,* 4: 809-818 (1994).
Hopkins et al., Magnetic Susceptibility Measurement of Insoluble Solids by NMR: Magnetic Susceptibility of Bone, *Magn Reson Med* 37: 494-500 (1997).
Jackson, et al., *Classical electrodynamics,* third edition: John Wiley and Sons, inc., pp. 184-188 (1999).
Kahn, *Molecular Magnetism,* Weiheim: Wiley-VCH, pp. 9-10 (1993).
Lee et al., Cerebral microbleeds are a risk factor for warfarin-related intracerebral hemorrhage, *Neurology,* 72: 171-176 (2009).
Li et al., Magnetic Susceptibility Quantification for Arbitrarily Shaped Objects in Inhomogeneous Fields, *Magn Reson in Med,* 46: 907-916 (2001).
Li et al. , Magnetic susceptibility quantitation with MRI by solving boundary value problems, *Med Phys,* 30(3): 449-453 (2003).

(56) References Cited

OTHER PUBLICATIONS

Li et al., Accounting for Signal Loss Due to Dephasing in the Correction of Distortions in Gradient-Echo EPI Via Nonrigid Registration, *IEEE Trans Med Imaging*, 26(12): 1698-1707 (2007).

Morgan et al, Efficient solving for arbitrary susceptibility distributions using residual difference fields, *Proceedings of the 15th Annual Meeting of the ISMRM*, Berlin, p. 35 (2007).

Schabel et al., Uncertainty and bias in contrast concentration measurements using spoiled gradient echo pulse sequences, *Phys Med Biol*, 53: 2345-2373 (2008).

Schweser et al, A Novel Approach for Separation of Background Phase in SWI Phase Data Utilizing the Harmonic Function Mean Value Property, *Stockholm, Sweden, Proc Intl Soc Magn Reson Med*, p. 142 (2010).

Sepulveda et al., Magnetic Susceptibility Tomography for Three-Dimensional Imaging of Diamagnetic and Paramagnetic Objects, *IEEE Transactions on Magnetics*, 30(6): 5062-5069 (1994).

Smirnov et al., In Vivo Single Cell Detection of Tumor-Infiltrating Lymphocytes With a Clinical 1.5 Tesla MRI System, *Magn Reson in Med*, 60: 1292-1297 (2008).

Stanisz et al., Gd-DTPA Relaxivity Depends on Macromolecular Content, *Magn Reson in Med*, 44: 665-667 (2000).

Stark et al., Hemorrhage, *Magnetic resonance imaging*, vol. III, 3rd ed, St. Louis, p. 1329-1345 (1999).

Terreno et al., Effect of the Intracellular Localization of a Gd-Based Imaging Probe on the Relaxation Enhancement of Water Protons, *Magn Reson in Med*, 55: 491-497 (2006).

Truong et al., Three-dimensional numerical simulations of susceptibility-induced magnetic field inhomogeneities in the human head, *Magn Reson Imaging*, 20: 759-770 (2002).

Wang et al., Magnetic Resonance Imaging Measurement of Volume Magnetic Susceptibility Using a Boundary Condition, *J Magn Reson*, 140: 477-481 (1999).

Weisskoff, et al., MRI Susceptometry: Image-Based Measurement of Absolute Susceptibility of MR Contrast Agents and Human Blood, *Magn Reson in Med.* 24: 375-383 (1992).

Wickline et al., Molecular Imaging and Therapy of Atherosclerosis With Targeted Nanoparticles, *J Magn Reson Imaging*, 25: 667-680 (2007).

Wu et al. Identification of Calcification with MRI Using Susceptibility-Weighted Imaging: A Case Study, *J Magn Reson Imaging*, 29: 177-182 (2009).

Yablonskiy et al., Theory of NMR signal Behavior in Magnetically Inhomogeneous Tissues: The Static Dephasing Regime, *Magn Reson Med*, 32: 749-763 (1994).

Yao, et al., Susceptibility contrast in high field MRI of human brain as a function of tissue iron content, *Neuroimage* 44:1259-1266 (2009).

Zhong et al., The molecular basis for gray and white matter contrast in phase imaging, *Neuroimage*, 40: 1561-1566 (2008).

Zurkiya et al, MagA is Sufficient for Producing Magnetic Nanoparticles in Mammalian Cells, Making it an MRI Reporter, *Magn Reson in Med*, 59: 1225-1231 (2008).

* cited by examiner

BACKGROUND FIELD REMOVAL METHOD FOR MRI USING PROJECTION ONTO DIPOLE FIELDS

CROSS-REFERENCE TO RELATED APPLICATIONS

This patent application claims the benefit of U.S. Provisional Patent Application No. 61/416,696, filed Nov. 23, 2010, which is incorporated by reference herein in its entirety.

STATEMENT REGARDING FEDERALLY SPONSORED RESEARCH AND DEVELOPMENT

This invention was made with Government support under Grant Numbers R01HL064647, R01HL062994 and UL1RR024996 awarded by the National Institutes of Health. The United States Government has certain rights in this invention.

BACKGROUND

The magnetic susceptibility of biomaterials generates a local magnetic field and provides a very important contrast mechanism in MRI, such as $T_2^*$-weighted imaging, susceptibility-weighted imaging (SWI) (see Haacke E M, Xu Y, Cheng Y C, Reichenbach J R. (2004) Susceptibility weighted imaging (SWI). Magn Reson Med 52(3):612-618 ("Haccke (2004)") and quantitative susceptibility mapping (QSM) (see de Rochefort L, Nguyen T, Brown R, Spincemaille P, Choi G, Weinsaft J, Prince M R, Wang Y. (2008) In vivo quantification of contrast agent concentration using the induced magnetic field for time-resolved arterial input function measurement with MRI. Medical physics 35(12): 5328-5339 ("de Rochefort (2008a)"); de Rochefort L, Liu T, Kressler B, Liu J, Spincemaille P, Wu J, Wang Y. (2009) A Weighted Gradient Regularization Solution to the Inverse Problem from Magnetic Field to Susceptibility Maps (Magnetic Source MRI): Validation and Application to Iron Quantification in the Human Brain. Proc ISMRM 462; de Rochefort L, Brown R, Prince M R, Wang Y. (2008b) Quantitative MR susceptibility mapping using piece-wise constant regularized inversion of the magnetic field. Magn Reson Med; 60(4):1003-1009 ("de Rochefort (2008b)"); Liu T, Spincemaille P, de Rochefort L, Kressler B, Wang Y. (2009) Calculation of susceptibility through multiple orientation sampling (COSMOS): a method for conditioning the inverse problem from measured magnetic field map to susceptibility source image in MRI. Magn Reson Med 61(1):196-204 ("Liu (2009)"); Kressler B, de Rochefort L, Liu T, Spincemaille P, Jiang Q, Wang Y. (2009) Nonlinear Regularization for Per Voxel Estimation of Magnetic Susceptibility Distributions From MRI Field Maps. IEEE transactions on medical imaging ("Kressler (2009)"); Li L, Leigh J S. (2004) Quantifying arbitrary magnetic susceptibility distributions with MR. Magnet Reson Med 51(5):1077-1082 ("Li (2004)"); Shmueli K, de Zwart J A, van Gelderen P, Li T Q, Dodd S J, Duyn J H. (2009) Magnetic susceptibility mapping of brain tissue in vivo using MRI phase data. Magn. Reson. Med. 62(6): 1510-1522 ("Shmueli (2009)")).

It has been reported that accurate QSM can be generated by combining information from magnitude and phase images (de Rochefort L, Liu T, Kressler B, Liu J, Spincemaille P, Lebon V, Wu J, Wang Y. (2010) Quantitative susceptibility map reconstruction from MR phase data using bayesian regularization: validation and application to brain imaging. Magn. Reson. Med. 63(1): 194-206 ("de Rochefort (2010)"). For appropriate phase masking in SWI and accurate susceptibility quantification in QSM (Fernandez-Seara M A, Techawiboonwong A, Detre J A, Wehrli F W. (2006) MR susceptometry for measuring global brain oxygen extraction. Magn Reson Med 55(5):967-973 ("Fernandez-Seara (2006)"), it is necessary to separate the local field in a given region of interest (ROI) from the background field. This background field arises from various sources, including imperfect shimming and magnetic susceptibility sources outside the ROI (both inside and outside the imaging volume). For example, in brain imaging, the air-tissue interfaces near the skull and various air cavities induce a strong background field variation extending deep into the brain. The background field is superimposed onto the local fields generated by venous blood, iron deposition and calcifications, impeding clear visualization of the local details in SWI and introducing errors in QSM.

Current background removal techniques assume that the local and background fields in a space spanned by the Fourier basis (see Wang Y, Yu Y, Li D, Bae K T, Brown J J, Lin W, Haacke E M. (2000) Artery and vein separation using susceptibility-dependent phase in contrast-enhanced MRA. J Magn Reson Imaging 12(5):661-670 ("Wang (2000)")) or polynomial functions are separable (see de Rochefort (2008b); Langham M C, Magland J F, Floyd T F, Wehrli F W. (2009) Retrospective correction for induced magnetic field inhomogeneity in measurements of large-vessel hemoglobin oxygen saturation by MR susceptometry. Magn Reson Med 61(3):626-633 ("Langham (2009)"); Yao B, Li T Q, Gelderen P, Shmueli K, de Zwart J A, Duyn J H. (2009) Susceptibility contrast in high field MRI of human brain as a function of tissue iron content. Neuroimage 44(4):1259-1266 ("Yao (2009)")), or require a priori knowledge of the spatial distribution of all background susceptibility sources (see Neelavalli J, Cheng Y C, Jiang J, Haacke E M. (2009) Removing background phase variations in susceptibility-weighted imaging using a fast, forward-field calculation. J Magn Reson Imaging 29(4):937-948 ("Neelavalli (2009)"); Koch K M, Papademetris X, Rothman D L, de Graaf R A. (2006) Rapid calculations of susceptibility-induced magnetostatic field perturbations for in vivo magnetic resonance. Physics in medicine and biology 51(24):6381-6402 ("Koch (2006)")). The assumption of the separability between local and background fields in a certain space is often violated, leading to erroneous estimation of local fields, and the results depend on the choice of the basis functions (see Langham (2009)). In practice, the knowledge of the background susceptibility source surrounding a given ROI is often not fully available or sufficiently accurate, particularly when there are significant variations in susceptibility outside the imaging field of view (FOV), leading to a substantial residual background field that requires additional attention (see Neelavalli (2009)). A reliable background field removal method is the use of reference scans, in which an identical object but with the susceptibility sources removed is scanned to measure the reference background field (see de Rochefort (2008b); Liu (2009)). However, it is impractical or impossible to perform a reference scan in many in vivo situations.

SUMMARY

The present invention provides a projection onto dipole fields (PDF) method of projecting the total field measured in a region of interest (ROI) onto the subspace spanned by background unit dipole fields. The total field measured in the ROI and all the background unit dipole fields may be used.

In an embodiment, a method is provided for removing background field from a region of interest in magnetic resonance imaging using magnetic susceptibility for contrast. The method includes obtaining magnetic resonance imaging data using magnetic susceptibility for contrast; calculating the background field by decomposing the field measured inside the region of interest into a field generated by dipoles outside the region of interest; and subtracting the calculated background field from the total measured field.

The decomposing may further include use of a projection in Hilbert space. The total field measured inside the region of interest may be decomposed. The field measured inside the region of interest may further be decomposed into all the dipoles. Poor shimming may be corrected prior to removing background. Spatial variants of noise may be corrected by normalizing the noise to a normal distribution.

In a further embodiment, the method may be implemented as computer-executable instructions stored on a tangible, non-transient computer-readable medium in a magnetic resonance imaging (MRI) system.

BRIEF DESCRIPTION OF THE SEVERAL VIEWS OF THE DRAWING(S)

FIG. 1 is a diagram of an exemplary MRI system that may be used in implementing the embodiments of the present invention described herein.

FIGS. 2a-2f are exemplary images showing approximate orthogonality between dipole fields. For each local dipole inside the region of interest (ROI), the maximum absolute normalized inner product between its field and any background unit dipole field is plotted in axial (a), coronal (b) and sagittal (c) sections of a typical ROI in human brain MRI (same as in FIG. 4 with the resolution reduced to a 80×60× 46 matrix for practical computing time). The inner product values are close to zero at most voxels, except for those near the boundary. The relative error (see text for definition) for each local dipole is shown in the axial (d), coronal (e) and sagittal (f) sections.

FIGS. 3a-3k are exemplary images showing validation in numerical simulation. A numerical brain phantom is shown in a prescribed field of view (FOV) in coronal view with the simulated total field (a), the corresponding reference background field (b), the reference local field with annotated hemorrhage (H) and veins (V) (c) and the defined region of interest (ROI) (white area) (d). The projection onto dipole fields (PDF) method was used to estimate the background susceptibility distribution (e). The PDF-estimated background field (f), the PDF-estimated local field (g) and the corresponding difference from the reference (h) showed substantial improvement over the high-pass filtering (HPF) method (i, j and k, corresponding to HPF-estimated background field, HPF-estimated local field and difference from the reference, respectively). The relative errors were 23.51% and 3.21% for the HPF and PDF methods, respectively. The black box in (a) indicates the region in which the attenuation of the local field was measured.

FIGS. 4a-4k are exemplary images showing validation in phantom MRI. Acquired three-dimensional data are shown in a coronal section with the total field (a), the corresponding reference background field (b), the reference local field (c) and the magnitude image (d) [with the large circular disk as the region of interest (ROI)]. The projection onto dipole fields (PDF) method was used to estimate the background susceptibility distribution (e). The PDF-estimated background field (f), the PDF-estimated local field (g) and the corresponding difference from the reference (h) showed substantial improvement over the high-pass filtering (HPF) method (i, j and k, corresponding to HPF-estimated background field, HPF-estimated local field and the difference from the reference, respectively). The relative errors were 18.36% and 5.53% for the HPF and PDF methods, respectively. The black box in (a) indicates the region in which the attenuation of the local field was measured.

Figure 5:
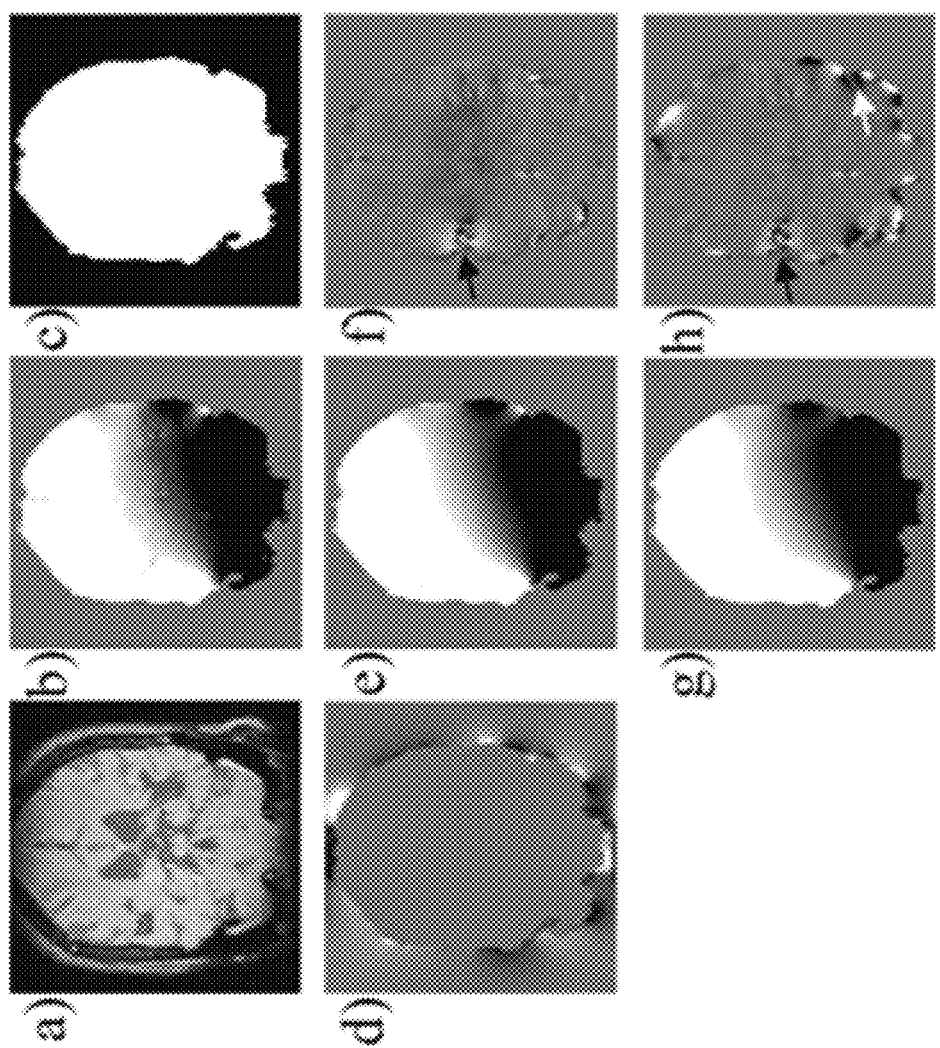

FIGS. 5a-5h are exemplary images showing patient brain imaging. Acquired three-dimensional data are shown in a coronal section with the magnitude image (a), the total field (b) and the region of interest (ROI) (white region) (c). FIG. 5(d) shows estimated background susceptibility distribution using the projection onto dipole fields (PDF) method. FIGS. 5(e, f) show background and local fields estimated by the PDF method. FIGS. 5(g, h) show background and local fields estimated by the high-pass filtering (HPF) method. The estimated local field generated by the PDF method provides better depiction of the hemorrhage (black arrows), with a higher visual contrast between the hemorrhage and the surrounding tissue and with less artifacts (white arrow).

DETAILED DESCRIPTION

Before turning to specific embodiments of the present invention, an exemplary environment suitable for various implementations is described. It will be appreciated that the described environment is an example, and does not imply any limitation regarding the use of other environments. With reference to FIG. 1, a block diagram of an exemplary MR system 100 for implementing embodiments of the invention is shown. The exemplary system includes a computer 102, a magnet system 104, a data acquisition system 106, and display 108. In general terms, the computer 102 controls the gradient and RF magnets or coils (not shown) in the magnet system 104 via amplifiers (not shown) that transmit control signals. The computer 102 also controls the data acquisition system 106 that receives signals received by receiver coils (not shown), processes the data acquired, and outputs an image to display 108. Computer 102 typically includes a variety of computer readable media. Computer readable media can be any available media that can be accessed by computer 102 and includes both volatile and nonvolatile media, removable, and non-removable media. It will be appreciated that certain embodiments of the invention may be described in the general context of computer-executable instructions, such as program modules, being executed by a computer such as a personal computer. The invention may also be practiced in distributed computing environments where tasks are performed by remote processing devices that are linked through a communications network.

A method that effectively fits the background field to the field generated by dipole sources outside a certain ROI is described in de Rochefort (2010), which is incorporated by reference herein in its entirety. This method was further confirmed by another group as described in Wharton S, Schafer A, Bowtell R. (2010) Susceptibility mapping in the human brain using threshold-based k-space division. Magn. Reson. Med. 63(5): 1292-1304 ("Wharton (2010)").

Herein we provide a detailed description of various exemplary embodiments of background field removal, which we term here the 'projection onto dipole fields' (PDF) method. We observe that the inner product of the field of a background dipole outside the ROI and the field of a local dipole inside the ROI is almost zero in the ROI, except for local dipoles near the boundary. This observation forms the foundation for the PDF method to differentiate the local and background fields. The performance of the PDF method was validated in a numerical simulation and a phantom experiment, and was applied to human brain MRI.

In the following description, reference is made to the accompanying drawings that form a part hereof, and in which is shown by way of illustration specific embodiments which may be practiced. These embodiments are described in detail to enable those skilled in the art to practice the invention, and it is to be understood that other embodiments may be utilized and that logical changes may be made without departing from the scope of the present invention. The following description of example embodiments is, therefore, not to be taken in a limited sense, and the scope of the present invention is defined by the appended claims.

In an embodiment, we have created and demonstrated a method to remove the background field from the measured total field in an ROI by projecting the total field inside the ROI to the fields generated by dipoles outside the ROI. The method is nonparametric. We validated the method in a numerical simulation, in a phantom study, and in a human brain imaging study. Our data demonstrate that this nonparametric background removal technique, PDF, is successful in removing the background field, whilst allowing an accurate estimation of the local field. Compared with the HPF method, the PDF method estimates the background fields with smaller errors and results in less attenuation of the local field with respect to the reference scan method in a numerical simulation and a phantom experiment. The PDF method provides superior local field maps for in vivo brain imaging with less artifacts near tissue-air boundaries and more contrast in local fields induced from different brain structures.

The HPF method performs background removal using the Fourier basis. The HPF method does not distinguish the source of the slowly varying components of the total field, either from the background or from the ROI. Hence, HPF suffers when there are overlaps between the Fourier spectra of the background and local fields. In general, the background field may contain high-spatial-frequency components and the local field may contain low-spatial-frequency components. Consequently, the HPF method may fail to remove the high-spatial-frequency components of the background field near air-tissue boundaries in brain imaging (FIG. 5h, white arrow), and may erroneously remove the low-spatial-frequency components of the local field (as demonstrated in FIG. 4i, where the uniform local field inside the vials and the slowly varying local fields outside the vials were removed). Therefore, the HPF method might not be suitable for the visualization of local fields of large brain structures, such as basal ganglia or hemorrhage, and brain structures near the brain ROI boundary. In addition, it has also been convincingly demonstrated that the results of the HPF method depend on the choice of the kernel size (see Wang (2000); Langham (2009); Wharton (2010). An increase in the kernel size can improve the removal of the unwanted background field, but at the cost of attenuating the local field.

Figure 2:
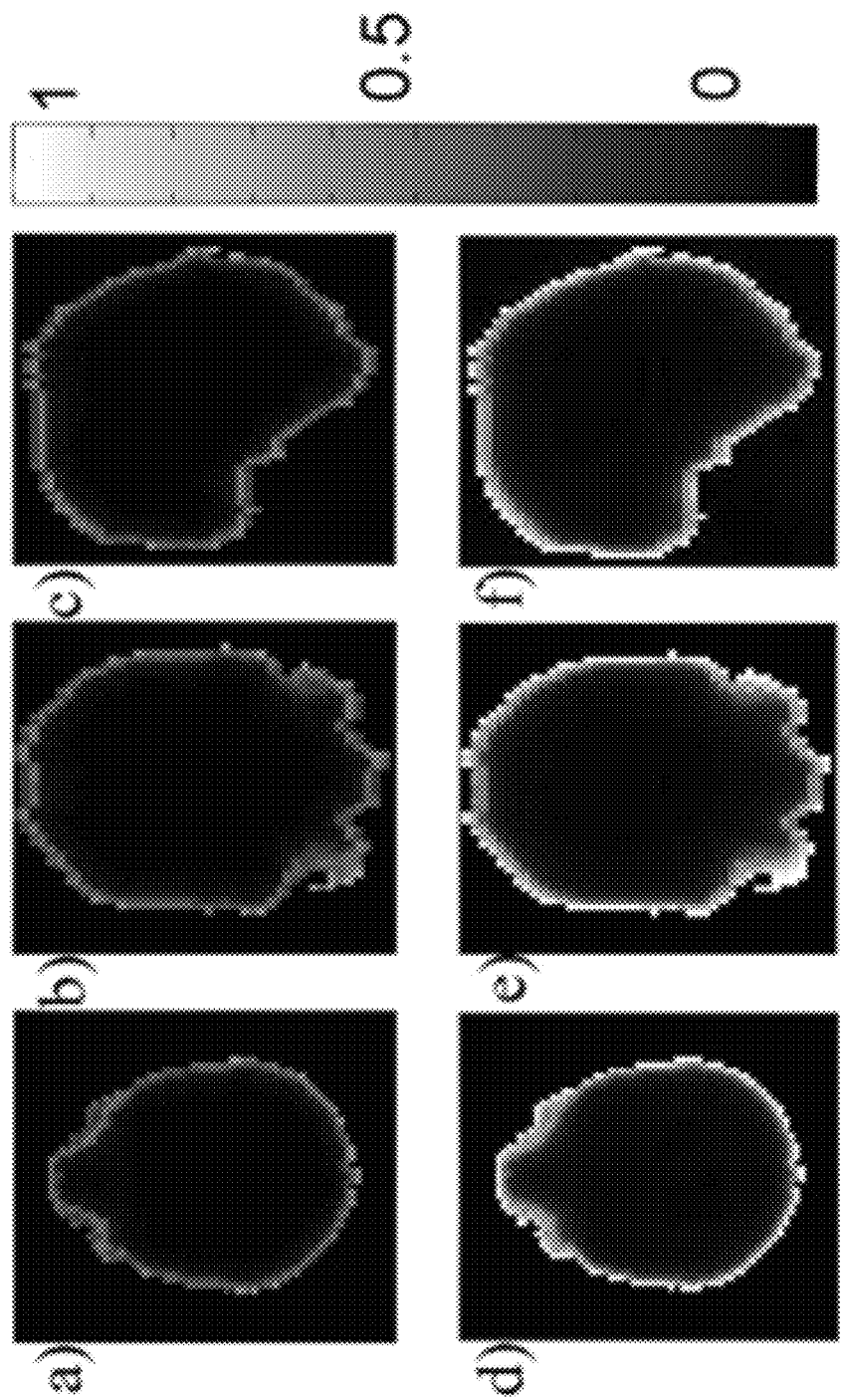

An advantage of the PDF method over the HPF method lies in the fact that there is substantial separation in the dipole field representations of the background and local fields, as measured by their approximate orthogonality (FIG. 2). According to the dipole equation (see Jackson J D. Classical electrodynamics, third edition: John Wiley and Sons, inc.; 1999 ("Jackson (1999)"), the strength of a dipole field decays on the order of $r^3$, where r is the distance to the dipole, so that the impact of the dipole is strong within its immediate vicinity and diminishes rapidly. Hence, if a local and a background dipole are far away in space, their spatial overlap, as measured by the normalized inner product, is very small. The separation between local and background fields may be fundamentally explained by the Maxwell equation, which states that the field generated by the background dipoles is a harmonic function inside the ROI, but the field generated by the local dipoles is nonharmonic (see Li L, Leigh J S. (2001) High-precision mapping of the magnetic field utilizing the harmonic function mean value property. J. Magn. Reson. 148(2): 442-448 ("Li (2001)")). Therefore, the background and local fields may be separable in an ideal harmonic function space. In the PDF method, the estimated background field generated by background dipoles is guaranteed to be a harmonic function. In comparison, the estimated background field by the HPF method may violate the harmonic condition.

This approximate orthogonality property provides a reasonable separability between the background and local fields, as demonstrated in the experimental results reported here. The PDF method's applicability to general MRI may be confirmed by evaluating the correlation quantity (see Equation [3] below) for a desired ROI shape numerically. This separability holds very well for the interior of the ROI (FIG. 2), making it very useful for brain imaging, where most of the strong susceptibility sources caused by brain iron deposits tend to be located deeper inside the brain. The PDF method also performed better than the HPF method (FIGS. 3h, k, 4h, k, 5f, h) near the ROI boundary, where the PDF performance may be further improved by means such as dilating the ROI by a few voxels to convert voxels near the original ROI boundary into interior points of the enlarged ROI.

Because a given magnetic field may arise from many susceptibility distributions as a result of the nontrivial null space of the dipole kernel convolution (see Haacke E M, Cheng N Y, House M J, Liu Q, Neelavalli J, Ogg R J, Khan A, Ayaz M, Kirsch W, Obenaus A. (2005) Imaging iron stores in the brain using magnetic resonance imaging. Magn. Reson. Imaging 23(1): 1-25 ("Haacke (2005)")), the intermediate background susceptibility distribution estimated during the PDF process may not correspond to the actual susceptibility distribution outside the ROI (FIGS. 3e, 4e, 5d). However, this does not affect the final calculation of the background field, which is our focus here. For instance, the Fourier aliasing in FIG. 3e (visible as the two white regions near the top of the FOV) is not a problem: its presence effectively modeled the background field at the bottom of the FOV that was, in reality, caused by susceptibility sources further below the FOV.

Theory: Approximate Dipole Filed Orthogonality and Projection Theorem

For a given ROI, the local field $f_L$ is defined as the magnetic field generated by the susceptibility distribution $\chi_L$ inside an ROI M, and the background field $f_B$ is defined as the magnetic field generated by the susceptibility distribution $\chi_B$ in the region $\overline{M}$, which is outside the ROI and inside a sufficiently large FOV. It should be noted that the background field extends into the ROI, just as the local field extends outside the ROI. For human MRI, tissue susceptibility satisfies $|\chi| \ll 1$, making the magnetic fields generated by human tissue susceptibility variation orders of magnitudes smaller than the main field. Taking this into account, the total magnetic field is written as:

$$f = f_L + f_B = d \otimes |\chi_L + \chi_B| \qquad [1]$$

Here, the symbol ⊗ denotes convolution and d is the unit dipole field, which is the magnetic field created by a unit dipole at the origin with the Lorentz sphere correction (see Li (2004); Haacke E M, Brown R W, Thompson M R. (1999) Objects in external fields: the Lorentz sphere. Magnetic Resonance Imaging: Physical Principles and Sequence Design. Wiley-Liss: New York, pp. 749-757 ("Haacke (1999)"); Jackson (1999)).

In an embodiment, our PDF method is to project the total field measured in the ROI onto the subspace spanned by the background unit dipole fields. The total field measured in the ROI may be used. All the background unit dipole fields may be used. This is related to the projection theorem in Hilbert space—as described in Moon T K, Stirling W C, "Pseudo-inverses and the SVD. Mathematical Methods and Algorithms for Signal Processing," Prentice Hall: Upper Saddle River, N.J., pp. 116-117 (2000) ("Moon (2000)"), which is incorporated herein by reference in its entirety—which we review briefly here. Let T be an inner product space spanned by all unit dipole responses $\{d_r | r \in M \cup \overline{M}\}$, where $d_r$ denotes the magnetic field induced by a unit dipole located at r. Hence, the total field f∈T. The inner product between any $f_1, f_2 \in T$ is defined as the sum of element-wise multiplication between $f_1$ and $f_2$ inside the ROI only. Following Equation [1], the background field component $f_B$ is formed of basis functions $\{d_{r_B} | r_B \in \overline{M}\}$, which represent fields created by background unit dipoles. The subspace spanned by all the background unit dipole fields is then denoted as B. Similarly, the basis functions of the local field component $f_L$ are $\{d_{r_L} | r_L \in M\}$ and the subspace spanned by all the local unit dipole fields is denoted as L. According to the projection theorem (see Moon (2000)), $\mathrm{argmin}\, f_{B \in B} \|f - f_B\|_2$ has a unique value $f^*_B$, and $f - f^*_B$ is orthogonal to B; if L⊥B, $f - f_B = f_L$ is orthogonal to B, and so $f^*_B$ obtained by the minimization is exactly $f_B$, the true background field. Therefore, the PDF method estimates the background field as:

$$\mathrm{argmin}\, \chi_{B \in \overline{M}} \|fd \otimes \chi_B\|_2 \quad [2]$$

To further validate the use of the projection theorem for removal of the background field in MRI, we evaluated the orthogonality assumption using a typical brain ROI segmented from an actual brain scan (detailed in the following in vivo brain scan section). Orthogonality requires that, for each given local unit dipole field, its inner product with any possible background unit dipole field is zero. Accordingly, we evaluated the correlation quantity $c(r_L)$, defined as the maximum absolute normalized inner product between a given local field induced by a unit dipole at $r_L \in M$ and any possible background unit dipole field:

$$0 \le c(r_L) = \max_{r_B \in \overline{M}} |\langle d_{r_L}, d_{r_B}\rangle| / (\|d_{r_L}\|_2 \times \|d_{r_B}\|_2) \le 1 \quad [3]$$

This maximum absolute normalized inner product $c(r_L)$ is almost zero [$c(r_L) \ll 0.1$], except for locations within five voxels from the boundary, as demonstrated in the realistic brain ROI (FIG. 2a-c). Therefore, the orthogonality between the background field subspace and the local field subspace is a good approximation.

Error Analysis

The approximate orthogonality does not guarantee that the local field will be perfectly recovered by the PDF method, but it does predict that large maximum absolute normalized inner products are likely to lead to greater errors in the estimated local field. To demonstrate the spatial dependence of error, the PDF method was performed on a simulated total field consisting of a single local unit dipole field $d_{r_L}$, $r_L \in M$ and a zero background field to generate an estimated background field $f^*_{b,r_L}$. The true background field is zero and, therefore, the PDF method should ideally not remove any part of the local field. Any residual $f^*_{b,r_L}$ represents an error in the background field estimated by the PDF method, which is quantified by calculating the ratio between the norms of the error ($f^*_{b,r_L} - 0$) and $d_{r_L}$ over the ROI: $E(r_L) = \|f^*_{b,r_L}\|_2 / \|d_{r_L}\|_2$. This relative error is visualized for every voxel r inside the ROI in FIG. 2d-f. It is observed that the error is low (E<0.1) for dipoles located at most of the voxels in the ROI, and increases for dipoles near the boundary of the ROI.

PDF Algorithm Implementation

In an embodiment, the computation of the total field f from MR phase data was based on phase data from multiple echo data—as described in de Rochefort (2008b), which is incorporated herein by reference in its entirety—followed by a magnitude image-guided unwrapping algorithm—as described in Cusack R, Papadakis N. (2002) New robust 3-D phase unwrapping algorithms: application to magnetic field mapping and undistorting echoplanar images. Neuroimage 16(3 Pt 1):754-764 ("Cusack (2002)"), which is incorporated herein by reference in its entirety. To correct for a large background field from potentially poor shimming, zeroth and first-order spherical harmonic terms in the field expansion were estimated and removed from the measured total field using a weighted least-square minimization—as described in de Rochefort (2008b) and in Wang (2000), which is incorporated herein by reference in its entirety. The corrected total field f was then used in all the following background removal methods.

We accounted for spatial variations of noise in the MR field maps by adding a weight to Equation [2] to normalize the noise to a normal distribution N(0,1). The weight w was derived from magnitude images across multiple echoes—as described in Kressler (2009), which is incorporated herein by reference in its entirety. The resulting minimization becomes:

$$\chi_B^* = \mathrm{argmin}_{\chi_B} \|w(f - d \otimes \chi_B)\|_2 \quad [4]$$

where the norm $\|\cdot\|_2$ in Equation [4] is again calculated only over the ROI M, which may be defined using image segmentation, and the dot symbol indicates point-wise multiplication between vectors.

We let N be the number of voxels in the MR image dataset, and expressed the measured total field f and the total susceptibility distribution χ as N×1 column vectors. Let I be an N×N identity matrix and M an N×N diagonal matrix, where the diagonal elements are equal to unity when they correspond to voxels inside the ROI and are equal to zero otherwise. Then, the background susceptibility was written as $\chi_B = (I-M)\chi$. D denotes an N×N matrix representing the convolution with the unit dipole field d, and W denotes an N×N diagonal matrix formed by placing the weighting w on the diagonal. With this notation, the minimizer in Equation [4] was found by solving (see Moon (2000)):

$$MWD(I-M)\chi = MWf \quad [5]$$

In a typical high-resolution three-dimensional brain MRI dataset with N>$10^6$ voxels, D has more than $10^{12}$ elements, which is currently difficult to explicitly form and store in computer memory. Therefore, a conjugate gradient (CG) algorithm was used in which the convolution is efficiently calculated in the Fourier domain (see Neelavalli (2009); Koch (2006); Marques J P, Bowtell R. (2005) Application of a Fourier-based method for rapid calculation of field inhomogeneity due to spatial variation of magnetic susceptibility. Concepts in Magnetic Resonance Part B: Magnetic Resonance Engineering 25B(1):65-78 ("Marques (2005)");

Salomir R, De Senneville B D, Moonen C T W. (2003) A fast calculation method for magnetic field inhomogeneity due to an arbitrary distribution of bulk susceptibility. Concept Magn Reson B 19B(1):26-34 ("Salomir (2003)"). The forward system on the left-hand side of Equation [5] was made positive semi-definite by applying the Hermitian conjugate of the matrix A=MWD(I−M) to both sides of Equation [5], as described in Björck A, Björck Å. "Iterative methods for least squares problems. Numerical Methods for Least Squares Problems," Society for Industrial Mathematics: Philadelphia, Pa., pp. 269-270 290-292 (1996), which is incorporated by reference herein in its entirety:

$$A^H A \chi = A^H \beta \qquad [6]$$

where β=MWf. The CG iteration was stopped when the norm of the residual was smaller than 50% of the expected noise level $\|A^H Mu\|_2$, where u was a column vector containing ones. Once χ* had been estimated, the background field was calculated as:

$$f_B^* = D\chi_R^* = D(I-M)\chi^* \qquad [7]$$

and was subtracted from the measured total field f to estimate the local field C.

Comparison with High-Pass Filtering (HPF)

In a study, the PDF method was compared with the HPF method that has been commonly used in the literature. In HPF, a three-dimensional Hann window low-pass filter with a kernel size of 32×32×32 was applied to the complex MRI data when one echo was used (see Wang (2000)). When multiple echoes were acquired, the low-pass filter was applied to a reconstructed complex MRI dataset formed by setting the magnitude equal to that of the first echo and the phase equal to the unwrapped total field normalized to [−π, π). The background field was estimated from the phase of the resulting low-pass-filtered complex image. All the algorithms were implemented on a personal computer with Intel® Core™ i7 CPU, 6-GB memory using MATLAB (2009a) code (MathWorks, Natick, Mass., USA).

Validation of Background Field Removal Methods

The reference scan method—as described in de Rochefort (2008b) and in Liu (2009), which is incorporated by reference herein in its entirety—can be used to estimate the local field without any algorithmic bias in both numerical simulation and phantom experiments, and served as the gold standard for the evaluation of any background field removal method, including the proposed PDF method.

Numerical Simulation

An ellipsoid whose radii were 40, 40 and 54 voxels was created in a 160×160×160 matrix to imitate the shape of a head. Five smaller ellipsoids were created inside the head-shaped ellipsoid to simulate mastoid cavities, ethmoid and maxillary sinuses. The radii of these ellipsoids ranged from 10 to 15 voxels. Three cylinders with a radius of two voxels and a length of 20 voxels were created to simulate veins and were placed inside the head-shaped ellipsoid along the x, y and z directions, respectively. A sphere with a radius of five voxels was created in the mid-brain to mimic a hemorrhage. Complex MRI data were simulated from this geometry. A uniform intensity of 100 was assigned to the 'head' region, and the 'air' cavities were assigned a value of zero. Susceptibility in the 'head' region was chosen to be the zero reference, the susceptibility of 'air' was 9.4 ppm (see de Rochefort (2008)), the vessels were 0.3 ppm (see Fernandez-Seara (2006)), and the hemorrhage was 1.2 ppm (see de Rochefort L, Liu T, Kressler B, Liu J, Spincemaille P, Wu J, Wang Y. (2009) A Weighted Gradient Regularization Solution to the Inverse Problem from Magnetic Field to Susceptibility Maps (Magnetic Source MRI): Validation and Application to Iron Quantification in the Human Brain. Proc ISMRM 462 ("de Rochefort (2009)")). The total field was calculated using a forward calculation (see Koch (2006); Marques (2005); Salomir (2003)). The reference background field was obtained by repeating the total field calculation in the same numerical phantom, but with the vessels and hemorrhage removed. The phase image was calculated from the total field by assuming TE=30 ms and a scanner field strength $B_0$ equal to 1.5 T. Zero-mean Gaussian white noise with a standard deviation of unity was added to both the real and imaginary parts of the complex images independently. Noise was not added to the reference scan. Finally, an 80×80×80 volume in the upper middle part was cropped from the 160×160×160 matrix to emulate a prescribed FOV that narrowly encompasses the brain (FIG. 3a-d). The 80×80×80 matrix was then used for subsequent simulations. The total field, the reference background field and the reference local field (obtained by subtracting the reference background field from the total field) are shown in FIG. 3a-c. An ROI M was chosen as the 'air-free' region (white regions in FIG. 3d) and $\overline{M}$ was the 'air' region (black regions in FIG. 3d). Estimated background fields were then calculated using both techniques, and subtracted from the total field to generate the estimated local fields. For quantitative comparison, relative errors of the background field were calculated to assess the goodness of the background removal. Relative errors were calculated by taking the noun of the difference between the estimated background field and the reference background field, and then normalized by the norm of the reference background field. The norms were calculated inside the ROI only. The attenuation of the local field as a result of the background removal processes was calculated as one minus the ratio between the norm of the estimated local field and the noun of the reference local field. The norms were calculated inside a manually defined rectangular volume comprising the susceptibility sources of interest to capture the local attenuation of the local field, whilst ignoring the amplification elsewhere, e.g. near the boundary of the ROI.

Figure 3:
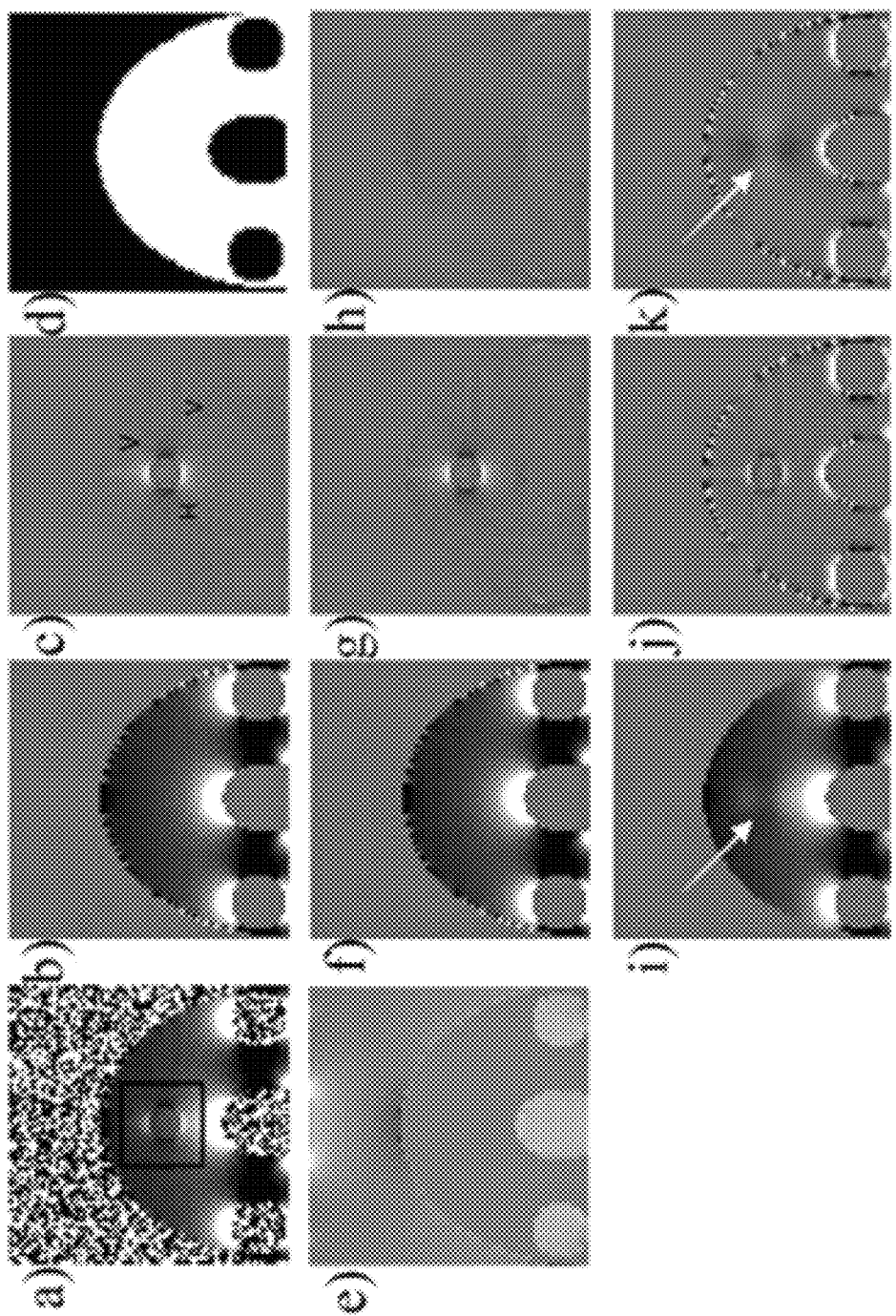

The results of the numerical simulation are shown in FIG. 3. The PDF method successfully removed the background field, leaving the local fields from 'veins' and 'hemorrhage' intact, leading to the distinct dipole pattern in the local field (FIG. 3g). There was little discernible visual difference between the local field estimated by the PDF method and the reference local field (FIG. 3h). In contrast, HPF left substantial residual background field in regions close to the 'ethmoid sinus' and 'mastoid cavities' (FIG. 3j), and removed indiscriminately the slowly varying component of the field induced by the 'hemorrhage' (FIG. 3i, k, arrows). The relative errors between the estimated and reference background fields were 23.51% and 3.21% for the HPF and PDF methods, respectively, and the attenuations of the local fields were 41.1% and 1.2%, respectively. The CG algorithm of the PDF method converged with 10 iterations in 0.7 s.

Phantom MRI Experiment

In a further embodiment, a cylindrical water phantom (diameter, 10 cm; height, 8.5 cm) was constructed. Three vials (diameter, 1.2 cm; height, 6 cm) with 1% concentrated gadolinium (Gd; Magnevist, Berlex Laboratories, Wayne, N.J., USA) were placed vertically in the water container to mimic three vessels. A waterproof plastic air box (2.5×2.5× 1.5 cm³) was glued to the bottom of the water container to imitate an air cavity. The phantoms were scanned on a 1.5-T clinical MRI scanner (General Electric Excite HD; GE Healthcare, Waukesha, Wis., USA) using a 5-in surface coil for signal reception. A dedicated three-dimensional gradient-echo sequence was designed to sample at different TEs in an interleaved manner. The scanning parameters were as follows: FOV, 15×15×10 cm$^3$; matrix size, 150×150×100; bandwidth, ±62.50 kHz; TR=30 ms; flip angle, 30°. Four TEs (1.7, 2.2, 4.2 and 14.2 ms) were used to achieve a balance between the precision of the estimated total field and the total scan time. After this scan had been completed, the three vials were removed from the water phantom. The scan was repeated with identical imaging parameters to acquire a reference background field. The scanner gradient shimming was kept constant between the two scans. The background air region without MR signal was segmented as $\overline{M}$ (background black region in FIG. 4d), and the rest was denoted as M. Noise was estimated from $\overline{M}$. Similar to the numerical simulation, estimated background fields were compared qualitatively and quantitatively with the reference background field.

Figure 4:
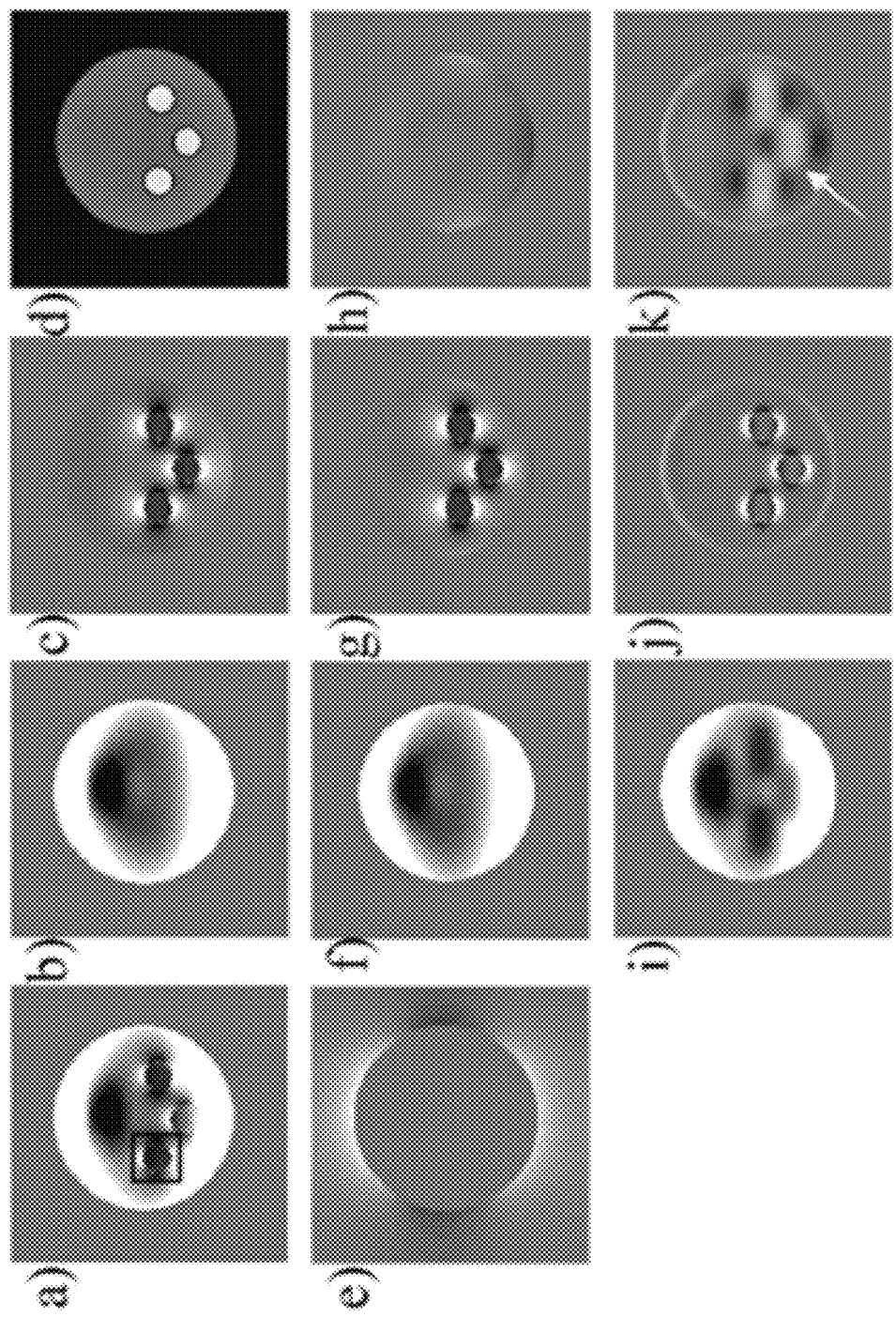

The results for the phantom experiment are shown in FIG. 4. The estimated background field by the PDF method was in good agreement with the reference background field (FIG. 4h), whereas the estimated background field by the HPF method contained a substantial amount of the local field (FIG. 4i, k, arrow). The relative errors between the estimated and reference background fields were 18.36% and 5.53% for the HPF and PDF methods, respectively, and the attenuations of the local fields were 43.0% and 3.2%, respectively. The CG algorithm of the PDF method converged with 43 iterations in 17.0 s.

In Vivo Brain Scan

In another further embodiment, in vivo MRI was performed on 15 patients with histories of hemorrhagic stroke on a 3-T clinical MRI scanner (General Electric Excite HD; GE Healthcare). Standardized data acquisition and data processing were performed on all patients in the following manner. Data were acquired using an eight-channel head coil and a multiple echo spoiled gradient-echo sequence with three-dimensional flow compensation. The imaging parameters were as follows: TE=3.5, 7, 10.5, 14, 17.5, 21 ms; TR=40 ms; slice thickness, 2 mm; flip angle, 15°; number of slices, 70 axially through the brain. The imaging matrix was 240×180×70, with a pixel bandwidth of 520 Hz per pixel and a FOV of 24×18×14 cm$^3$. The phase images were used to fit the total field. The brain region was segmented and denoted as the ROI M, and the remaining regions in the imaging volume were considered to comprise $\overline{M}$. Estimated background fields were obtained and removed using both techniques. The three-dimensional brain data was reformatted to coronal sections for inspection. To quantitatively assess the improvement of the PDF method, field contrasts were calculated from PDF and HPF processed field maps. Rectangular volumes immediately superior to the hemorrhages and volumes on the right of the hemorrhages were drawn, and the differences between the mean values insides these two regions were calculated. These two regions fall inside two lobes of the dipole field that have opposite sign. The resulting contrast measurements were compared between the HPF and PDF methods over the 15 patients using a two-tailed paired t-test with a significance level p of 0.01.

Hemorrhages were found in all patients, with an example illustrated in FIG. 5. Compared with the estimated local field by the PDF method (FIG. 5o, the estimated local field by the HPF method contained substantially more field variation at the periphery of the brain ROI, which might be interpreted as high-spatial-frequency residual background field because of the air-tissue interface (FIG. 5h, white arrow). The local fields arising from the hemorrhagic lesion estimated by the PDF method were stronger than those estimated by the HPF method (black arrows), resulting in a better contrast in the field maps between the hemorrhage and the surrounding tissue by the PDF method. Quantitatively, the PDF-processed image showed higher field contrast than the HPF-processed image for each of the 15 cases (21±8 Hz versus 12±5 Hz, p<0.001).

In addition to the disclosure already provided herein, the following articles are included by reference herein in their entireties:

Liu J, Liu T, de Rochefort L, Ledoux J, Khalidov I, Chen W, Tsiouris A J, Wisnieff C, Spincemaille P, Prince M R, Wang Y., Morphology enabled dipole inversion for quantitative susceptibility mapping using structural consistency between the magnitude image and the susceptibility map. Neuroimage. 2011 Sep. 8. [Epub ahead of print]

Liu T, Liu J, de Rochefort L, Spincemaille P, Khalidov I, Ledoux J R, Wang Y., Morphology enabled dipole inversion (MEDI) from a single-angle acquisition: comparison with COSMOS in human brain imaging. Magn Reson Med. 2011 September; 66(3):777-83. doi: 10.1002/mrm.22816. Epub 2011 Apr. 4.

Liu T, Khalidov I, de Rochefort L, Spincemaille P, Liu J, Tsiouris A J, Wang Y., A novel background field removal method for MRI using projection onto dipole fields (PDF). NMR Biomed. 2011 November; 24(9): 1129-36.

Liu T, Spincemaille P, de Rochefort L, Wong R, Prince M, Wang Y. m Unambiguous identification of superparamagnetic iron oxide particles through quantitative susceptibility mapping of the nonlinear response to magnetic fields. Magn Reson Imaging. 2010 November; 28(9):1383-9.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for removing background field from a spatial region of interest in magnetic resonance imaging using magnetic susceptibility for contrast, comprising:
    obtaining, from a magnetic resonance imaging system, magnetic resonance imaging data using magnetic susceptibility for contrast;
    calculating, by a processing system, the background field by decomposing a field measured inside the spatial region of interest into a field generated by dipoles outside the spatial region of interest; and
    generating and outputting, by the professing system, magnetic susceptibility maps with enhanced contrast based on removing the calculated background field, wherein removing the calculated background field comprises subtracting the calculated background field from a total measured field.

2. The method of claim 1 wherein said decomposing comprises projecting the field measured inside the spatial region of interest in Hilbert space to estimate a background susceptibility distribution outside of the spatial region of interest corresponding to the dipoles outside of the spatial region of interest.

3. The method of claim 1 wherein the total field measured inside the spatial region of interest is decomposed.

4. The method of claim 1 wherein the field measured inside the spatial region of interest is decomposed into all the dipoles.

5. The method of claim 1 wherein poor shimming is corrected prior to removing background.

6. The method of claim 1 further comprising correcting spatial variants of noise by normalizing the noise to a normal distribution.

7. A system for magnetic resonance imaging comprising a tangible, non-transitory computer-readable medium having computer-executable instructions thereon for removing background field from a spatial region of interest in magnetic resonance imaging using magnetic susceptibility for contrast, the computer-executable instructions, when executed, facilitating performance of the following:
    obtaining, from a magnetic resonance imaging system, magnetic resonance imaging data using magnetic susceptibility for contrast;
    calculating, by a processing system, the background field by decomposing a field measured inside the spatial region of interest into a field generated by dipoles outside the spatial region of interest; and
    generating and outputting, by the processing system, magnetic susceptibility maps with enhanced contrast based on removing the calculated background field, wherein removing the calculated background field comprises subtracting the calculated background field from a total measured field.

8. The system of claim 7, wherein calculating the background field further comprises projecting the field measured inside the spatial region of interest in Hilbert space to estimate a background susceptibility distribution outside of the spatial region of interest corresponding to the dipoles outside of the spatial region of interest.

9. The system of claim 7, wherein calculating the background field further comprises decomposing the total field measured inside the spatial region of interest.

10. The system of claim 7, wherein calculating the background field further comprises decomposing the field measured inside the spatial region of interest into all the dipoles.

11. The system of claim 7, wherein the computer-executable instructions, when executed, further facilitate:
    correcting poor shimming prior to removing background.

12. The system of claim 7, wherein the computer-executable instructions, when executed, further facilitate:
    correcting spatial variants of noise by normalizing the noise to a normal distribution.

13. The method of claim 2, wherein the background field is calculated from the background susceptibility distribution outside of the spatial region of interest.

14. The system of claim 8, wherein the background field is calculated from the background susceptibility distribution outside of the spatial region of interest.

* * * * *